(12) United States Patent
Omae et al.

(10) Patent No.: US 9,129,931 B2
(45) Date of Patent: Sep. 8, 2015

(54) POWER SEMICONDUCTOR MODULE AND POWER UNIT DEVICE

(75) Inventors: Katsuhiko Omae, Tokyo (JP); Mamoru Watanabe, Tokyo (JP); Tetsushi Watanabe, Tokyo (JP); Yoshihito Asao, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/989,932

(22) PCT Filed: Apr. 27, 2011

(86) PCT No.: PCT/JP2011/060250
§ 371 (c)(1),
(2), (4) Date: May 28, 2013

(87) PCT Pub. No.: WO2012/127696
PCT Pub. Date: Sep. 27, 2012

(65) Prior Publication Data
US 2013/0241047 A1    Sep. 19, 2013

(30) Foreign Application Priority Data
Mar. 24, 2011  (JP) .................................. 2011-065703

(51) Int. Cl.
*H01L 23/34* (2006.01)
*H01L 23/367* (2006.01)
*H01L 23/495* (2006.01)
*H01L 23/00* (2006.01)
*H01L 23/31* (2006.01)

(52) U.S. Cl.
CPC ........ *H01L 23/367* (2013.01); *H01L 23/49524* (2013.01); *H01L 23/49562* (2013.01);
(Continued)

(58) Field of Classification Search
CPC ................... H01L 23/49562; H01L 23/49575; H01L 24/34; H01L 23/49568; H01L 23/367; H01L 23/49524; H01L 23/3107; H01L 2224/32245; H01L 2924/014; H01L 2924/13091; H01L 2924/01029; H01L 2224/40137; H01L 2924/13055
See application file for complete search history.

(56) References Cited

U.S. PATENT DOCUMENTS 6,329,714 B1    12/2001  Guillot
2001/0014487 A1*  8/2001  Guillot .......................... 438/106
(Continued)

FOREIGN PATENT DOCUMENTS

CN       1327521 C     7/2007
JP       60129136 U    8/1985
(Continued)

OTHER PUBLICATIONS
Japanese Office Action (Notification of Reasons for Refusal), issued Jan. 14, 2014, Application No. 2013-505760.
(Continued)

*Primary Examiner* — Yasser A Abdelaziez
(74) *Attorney, Agent, or Firm* — Sughrue Mion, PLLC; Richard C. Turner

(57) ABSTRACT

A power semiconductor module includes: a plurality of first metal plates arranged in the same planar state; a power semiconductor chip mounted on the first metal plate; and an overbridge-shaped second metal plate which is composed of bridge frame sections and leg sections that support the bridge frame sections, the leg sections being for appropriately performing solder bonding between electrodes of the power semiconductor chips and between the electrode of the power semiconductor chip and the first metal plate, the power semiconductor module being configured by a resin package in which these members are sealed with electrically insulating resin. In the power semiconductor module, the solder bonding section of the leg section is formed in a planar shape by bending process and is provided at a position lower than the bridge frame section.

21 Claims, 5 Drawing Sheets

(52) U.S. Cl.
CPC .... *H01L23/49568* (2013.01); *H01L 23/49575* (2013.01); *H01L 24/37* (2013.01); *H01L 24/40* (2013.01); *H01L 24/83* (2013.01); *H01L 24/84* (2013.01); *H01L 23/3107* (2013.01); *H01L 24/29* (2013.01); *H01L 2224/2929* (2013.01); *H01L 2224/29101* (2013.01); *H01L 2224/32245* (2013.01); *H01L 2224/37013* (2013.01); *H01L 2224/40137* (2013.01); *H01L 2224/73263* (2013.01); *H01L 2224/8314* (2013.01); *H01L 2224/84138* (2013.01); *H01L 2224/84801* (2013.01); *H01L 2924/014* (2013.01); *H01L 2924/01029* (2013.01); *H01L 2924/07802* (2013.01); *H01L 2924/1305* (2013.01); *H01L 2924/1306* (2013.01); *H01L 2924/13055* (2013.01); *H01L 2924/13091* (2013.01); *H01L 2924/351* (2013.01)

(56) References Cited

U.S. PATENT DOCUMENTS

| 2002/0190374 A1 | 12/2002 | Nakajima et al. | |
|---|---|---|---|
| 2009/0218673 A1* | 9/2009 | Sun et al. | 257/690 |

FOREIGN PATENT DOCUMENTS

| JP | 4-42742 U | 4/1992 |
| JP | 4-170037 A | 6/1992 |
| JP | 6-77380 A | 3/1994 |
| JP | 11-204724 A | 7/1999 |
| JP | 2000-4089 A | 1/2000 |
| JP | 2005-72098 A | 3/2005 |
| JP | 2009-105350 A | 5/2009 |
| JP | 4540884 B2 | 9/2010 |
| WO | 2009/110376 A1 | 9/2009 |

OTHER PUBLICATIONS

Communication dated Nov. 4, 2014 from the Japanese Patent Office in counterpart application No. 2013-505760.

Communication dated Aug. 26, 2014, issued by the Japan Patent Office in corresponding Japanese Application No. 2013-505760.

Communication dated Jun. 3, 2015 from the Chinese Intellectual Property Office issued in corresponding Chinese application No. 201180064783.4.

* cited by examiner

POWER SEMICONDUCTOR MODULE AND POWER UNIT DEVICE

CROSS REFERENCE TO RELATED APPLICATIONS

This application is a National Stage of International Application No. PCT/JP2011/060250 filed Apr. 27, 2011, claiming priority based on Japanese Patent Application No. 2011-065703 filed Mar. 24, 2011, the contents of all of which are incorporated herein by reference in their entirety.

TECHNICAL FIELD

The present invention relates to power semiconductor modules and, more particularly, relates to a power semiconductor module which constitutes a part of an inverter circuit and/or a relay circuit for a rotary electric machine, for example, a motor of a vehicular electric power steering device.

BACKGROUND ART

As a conventional power semiconductor module, for example, one disclosed in Japanese Patent Gazette No. 4540884 (Patent Document 1) may be used. In such a module, a plurality of semiconductor devices are directly arranged on a conductive heat dissipation substrate and these are integrally formed in a resin package by transfer mold molding together with a plurality of external connection electrodes electrically connected to the semiconductor devices.

A mold package of a portion on the opposite surface side to the surface of the heat dissipation substrate on which the plurality of the semiconductor devices are arranged is thin; heat emitted from the semiconductor devices passes through the heat dissipation substrate and then passes through the thin resin package; and after that, the heat is dissipated to a heat sink or the like attached to the outside of the power semiconductor module. Incidentally, the power semiconductor module and the heat sink are bonded via heat dissipating insulation adhesive or the like.

Furthermore, power line connection between the semiconductor devices is bonded by performing a plurality of wire bonding in order to secure current capacity.

PRIOR ART DOCUMENT

Patent Document

Patent Document 1: Japanese Patent Gazette No. 4540884

DISCLOSURE OF THE INVENTION

Problems to be Solved by the Invention

However, in the thus configured power semiconductor module, a plurality of external connection terminals and the heat dissipation substrate, which are respectively individually prepared, are bonded by soldering or the like; and therefore, a problem exists that the module increases additionally by bonding area and reduction in size is disturbed.

Furthermore, a structure is such that the heat emitted from the semiconductor device passes through the heat dissipation substrate and then passes through the mold package with low thermal conductivity; and therefore, this is disadvantageous in respect of heat dissipation properties. As a result, heat dissipation performance has to be secured by enlarging the area of the heat dissipation substrate; and accordingly, the heat dissipation properties and the reduction in size of the module are disturbed.

In addition, the power lines wired by the plurality of wire bonding are performed in order to secure the current capacity; however, there exists a constraint in view of workability and reduction of internal resistance is limited. In addition, a lot of wire bonding needs to be performed and a problem also exists in respect of reliability.

The present invention has been made to solve the foregoing problem and is to provide a power semiconductor module in which reduction in size is possible, heat dissipation properties are good, internal resistance is reduced, and reliability is high. Furthermore, in a connection structure with an actuator, the structure is made such that terminals of the power semiconductor module can be diverted, whereby it becomes possible to achieve reduction in size and reduction in cost.

Means for Solving the Problems

According to the present invention, there is provided a power semiconductor module including: a plurality of first metal plates arranged in the same planar state; a power semiconductor device (hereinafter, referred to as "power semiconductor chip") mounted on the first metal plate; and an over-bridge-shaped second metal plate which is composed of bridge frame sections and leg sections that support the bridge frame sections, the leg sections being for appropriately performing solder bonding between electrodes of the power semiconductor chips and between the electrode of the power semiconductor chip and the first metal plate, the power semiconductor module being configured by a resin package in which these members are sealed with electrically insulating resin. In the power semiconductor module, the solder bonding section of the leg section is formed in a planar shape by bending process and is provided at a position lower than the bridge frame section.

Furthermore, according to the present invention, there is provided a power unit device in which a power semiconductor module is placed on a heat sink portion, the power unit device including: a heat conductive member which is sandwiched between the power semiconductor module and the heat sink portion, the heat conductive member being for dissipating heat from the power semiconductor module; and a pressing mechanism which presses the power semiconductor module against the heat sink portion via the heat conductive member.

Advantageous Effect of the Invention

According to a power semiconductor module of the present invention, a bonding section with a semiconductor chip and a bonding section with a first metal plate, which are configured by means of a second metal plate, are formed to be lower than other sections, whereby solder of the bonding sections of the second metal plate is not run off from electrodes and bonding can be stably performed. Furthermore, solder fillets around the bonding section are stably formed, whereby connection becomes stable. In addition, the second metal plate is of a bent structure at the bonding section, whereby thermal stress can be relaxed and reliability is improved. Further, the second metal plate can be configured to be substantially the same width as the electrode of the semiconductor chip and internal resistance can also be reduced.

Besides, according to a power unit device of the present invention, it becomes easy to suppress variation in thermal resistance between a power semiconductor module and a heat sink portion, and heat dissipation properties are stabilized.

BRIEF DESCRIPTION OF THE DRAWINGS

FIG. 2A is a plan view, and FIG. 2B is an enlarged sectional view taken along the line A-A in FIG. 2A;

FIG. 5A is a plan view in which a resin mold package is seen from a back surface, and FIG. 5B is an enlarged sectional view taken along the line B-B in FIG. 5A;

MODE FOR CARRYING OUT THE INVENTION

Figure 1:
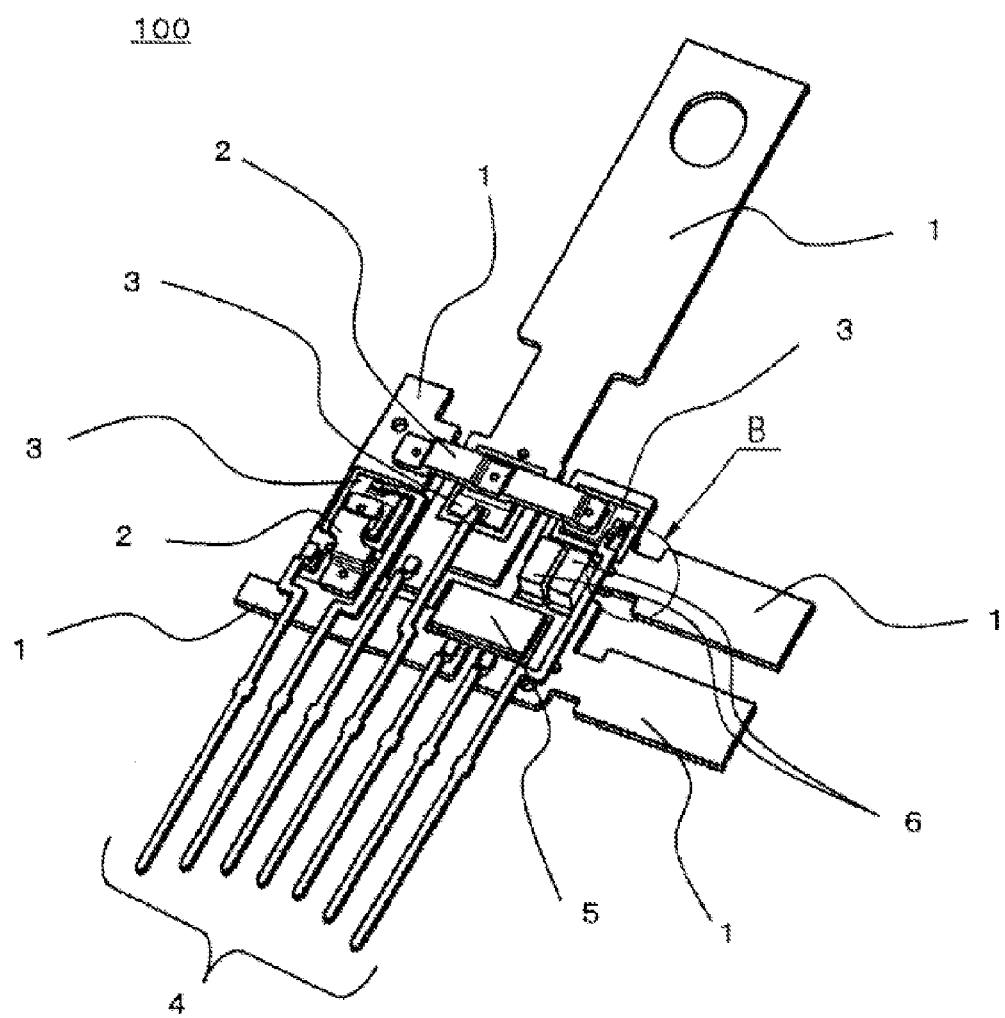
FIG. 1 is a perspective view showing a power semiconductor module according to Embodiment 1 of the present invention.

A power semiconductor module according to the present invention is not one which limits internal circuit configuration; however, as an example, a three-phase bridge inverter circuit having a power circuit that uses a power metal oxide semiconductor field effect transistor (power MOSFET) will be described in Embodiment 1.

Hereinafter, respective embodiments of the present invention will be described with reference to drawings.

Incidentally, the same reference numerals as those in respective drawings represent the same or corresponding elements.

Embodiment 1

Hereinafter, Embodiment 1 of the present invention will be described with reference to FIG. 1 to FIG. 4.

Figure 2A:
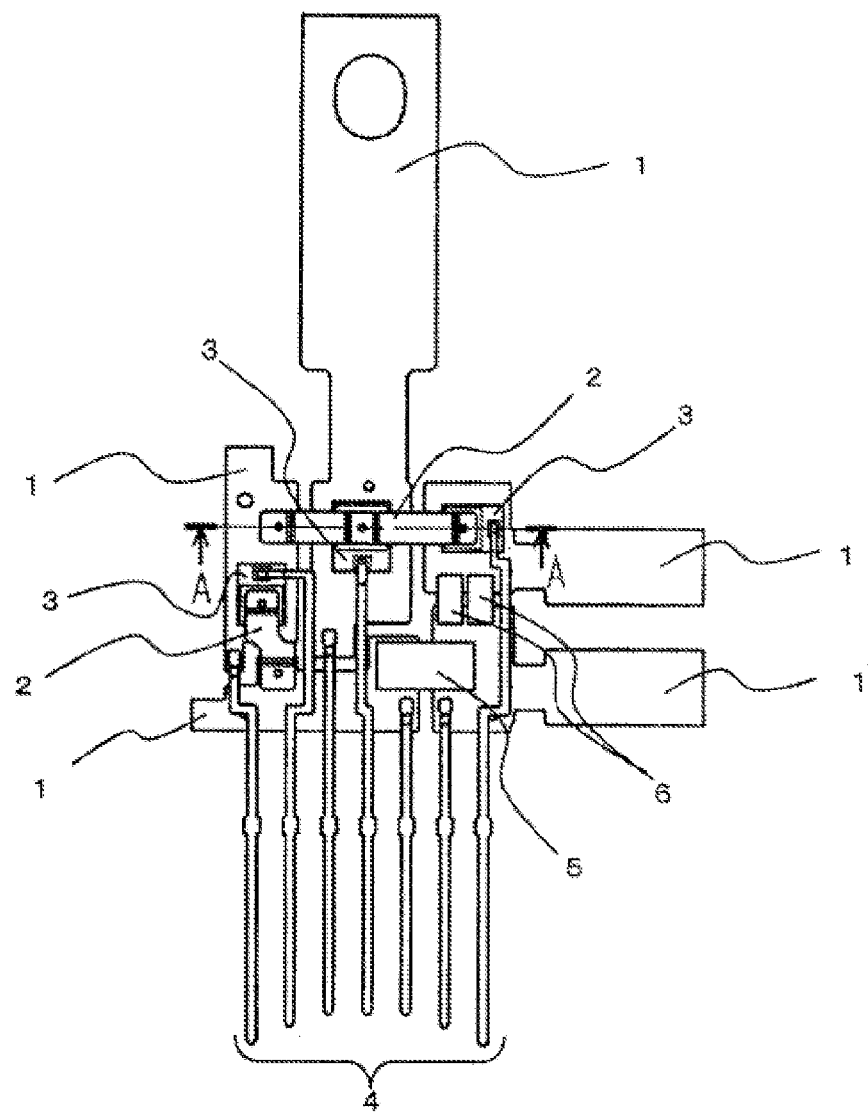
FIGS. 2A and 2B each shows the power semiconductor module according to Embodiment 1 of the present invention.

FIG. 1 is a perspective view showing the configuration of a power semiconductor module 100 according to Embodiment 1, and is the perspective view in which a resin mold package 7 is omitted and only the inside is shown. FIG. 2A is a plan view of the power semiconductor module 100; and FIG. 2B is an enlarged sectional view taken along the line A-A.

Figure 2B:
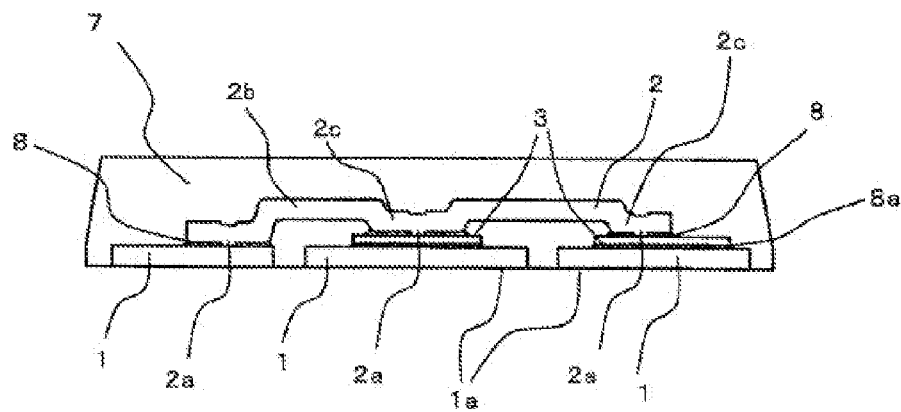
Figure 3:
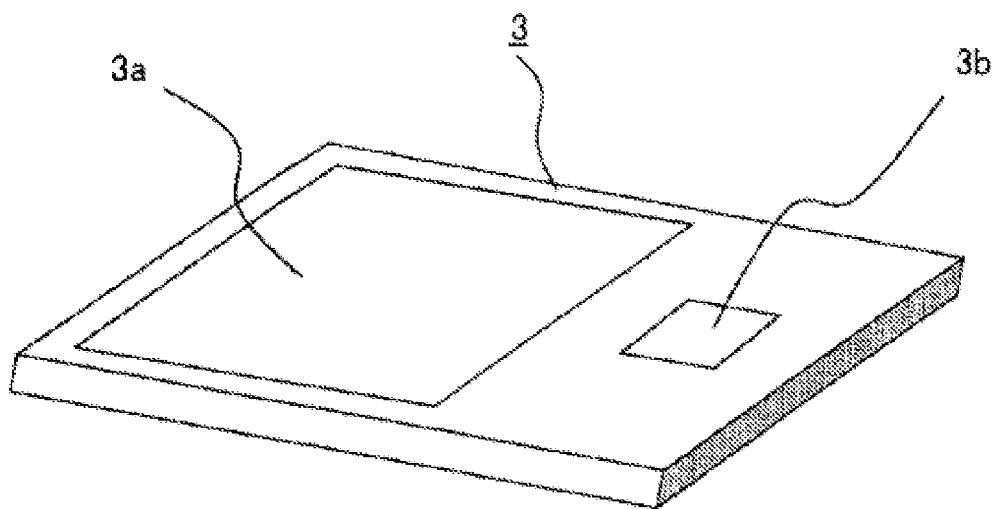
FIG. 3 is a perspective view of the power semiconductor chip according to Embodiment 1 of the present invention.
Figure 4:
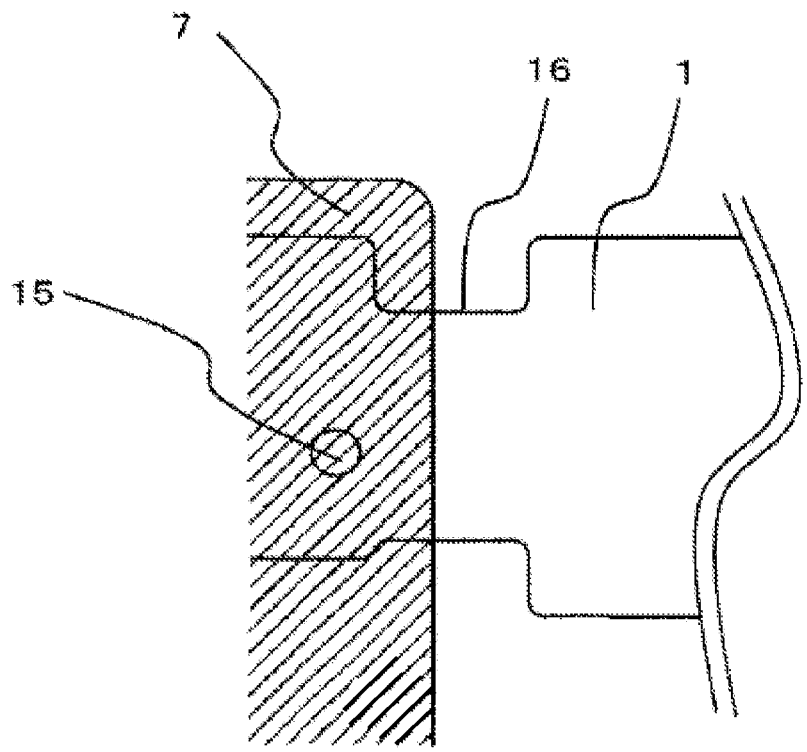
FIG. 4 shows a relevant part of the power semiconductor module according to Embodiment 1 of the present invention, and is an enlarged view of a section B in FIG. 1.
Figure 5A:
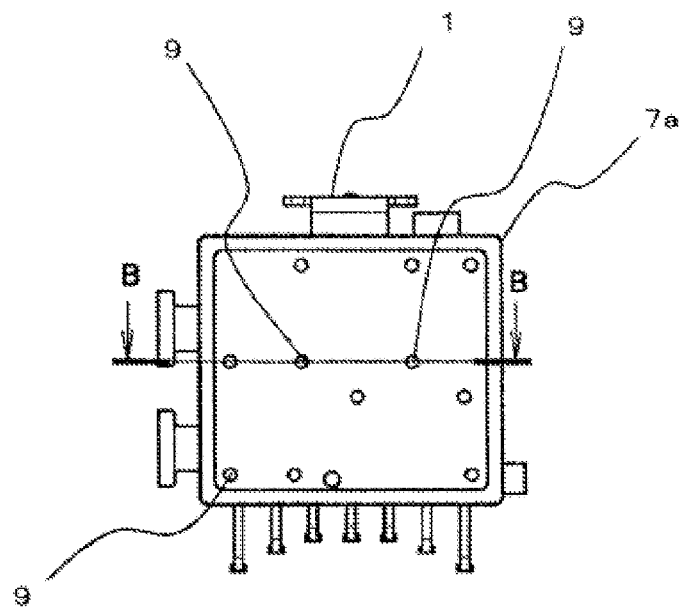
FIGS. 5A and 5B each shows a relevant part of the power semiconductor module according to Embodiment 1 of the present invention.
Figure 5B:
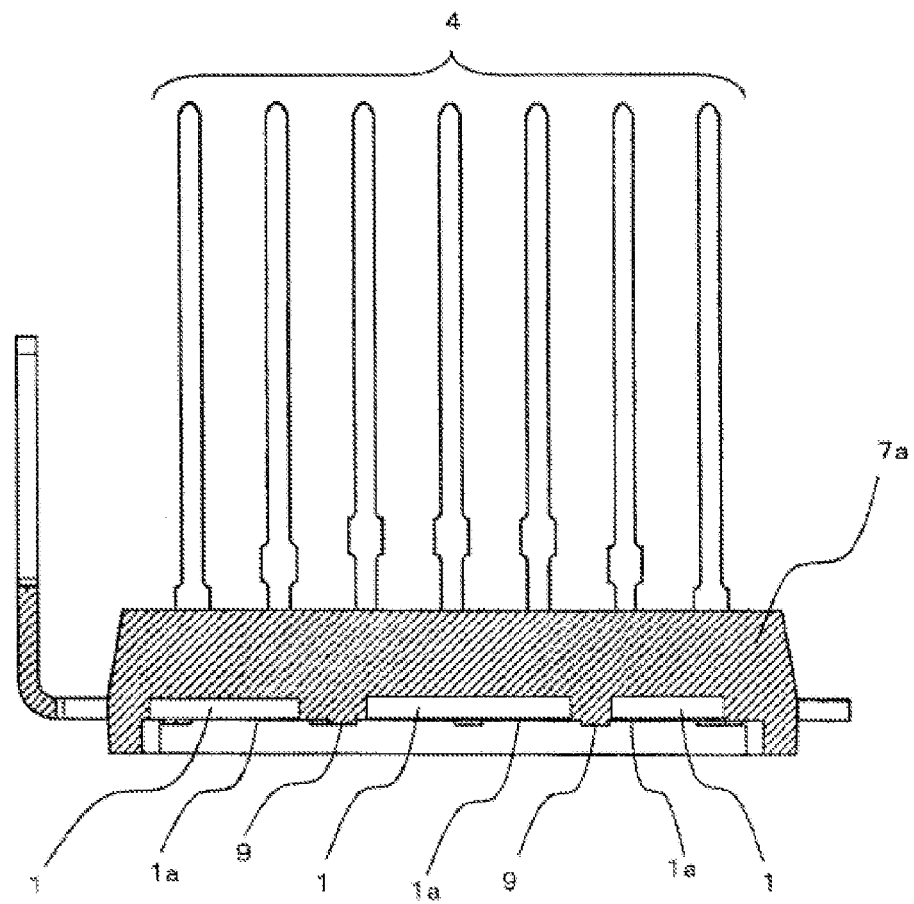

FIG. 3 is a perspective view showing an electrode section of a power semiconductor chip 3 shown in FIG. 1 and FIGS. 2A and 2B. FIG. 4 is an enlarged view of a section B in FIG. 1. FIG. 5A is a plan view in which the resin mold package 7 is seen from the back surface side; and FIG. 5B is an enlarged sectional view taken along the line B-B.

As shown in FIG. 1 and FIGS. 2A and 2B, total five first metal plates 1 are arranged in the same planar state; and three of the five first metal plates 1 are each mounted with one power semiconductor chip 3 (total three power semiconductor chips). The power semiconductor chip 3 is a MOSFET chip and has a source electrode 3a and a gate electrode 3b on one surface thereof as shown in FIG. 3; and the power semiconductor chip 3 has a drain electrode on the opposite surface thereof.

The drain electrode of the power semiconductor chip 3 and the first metal plate 1 are mechanically and electrically connected by solder 8a. Even a conductive connection member such as conductive adhesive may be permissible as a connection member.

FIGS. 2A and 2B each shows a structure in which the second metal plate 2 connects between the source electrodes 3a of the power semiconductor chips and to the first metal plate 1. Hereinafter, a detailed description will be made with reference to the enlarged sectional view of FIG. 2B.

The second metal plate 2 is substantially the same width as the electrode on the upper surface of the power semiconductor chip; and the second metal plate 2 is composed of bridge frame sections 2b and leg sections 2c that support the bridge frame sections. The second metal plate 2 is made of metal-plate material having good thermal conductivity and electrical conductivity such as copper alloy; and tin plating process, nickel plating process, or the like is appropriately applied totally or partially.

The second metal plate 2 connects between the respective source electrodes 3a of the power semiconductor chips 3; and the second metal plate 2 further extends at the bridge frame section 2b and its leg section 2c is connected to other first metal plate 1 (the left side in the drawing).

In this case, each bonding section corresponding to the leg section 2c of the second metal plate 2 is formed in a planar shape by bending so as to be lower than other section (bridge frame section 2b) and solder 8 is filled to only the bonding section. Furthermore, the second metal plate 2 is bent; and consequently, stress on the solder section due to thermal contraction of the first metal plate 1 and the resin mold package 7 is relaxed, heat cycle properties are improved, and durability is also improved against thermal stress due to self-heating.

Furthermore, a protrusion 2a is formed toward a solder surface (downward in the drawing) at the solder bonding section of the second metal plate 2 and a constant gap can be secured at the solder bonding section. The height of the protrusion 2a is appropriately adjusted; and consequently, the amount of the solder 8 of the bonding section can be controlled and durability can be improved.

Incidentally, in FIGS. 2A and 2B, the protrusion 2a is formed on all the solder bonding sections of the second metal plate 2 (both the bonding surface with the electrode of the power semiconductor chip and the bonding surface with the first metal plate); however, the protrusion 2a may be formed on only either one of the bonding surfaces.

The gate electrode 3b of the power semiconductor chip 3 is similarly connected to a different signal terminal 4 by solder; and after a shunt resistor 5 and capacitors 6 are bonded by solder on the first metal plate 1, the whole is sealed as the resin mold package 7.

At this time, a part of the first metal plate 1 and a part of the signal terminals 4 are extended outside the mold package and are used as terminals for electrical connection.

FIG. 4 is a view in which the section B of FIG. 1 is enlarged and shows a section where the first metal plate 1 is drawn out from the resin mold package 7.

A configuration is made such that an external end section of the first metal plate 1 forms an external connection terminal, the external end section being drawn out from the resin mold package 7; a base section on the inside of the resin mold package, which is a boundary line section with the mold of the first metal plate 1, is formed slimmer than other section and in a narrowed shape; and this narrowed section 16 is filled with resin of the resin mold package.

The resin runs round to the narrowed section; and consequently, strength is increased in the case where horizontal stress is applied to the first metal plate 1 serving as the terminal and breakdown tolerance against external stress can be improved. This causes the narrowed configuration section to play a role of an anchor even when the horizontal stress is applied to the external connection terminal, strength is enhanced, peeling off of the resin can be prevented, and reliability is improved.

Furthermore, the base section on the inside of the resin mold package of the external connection terminal is formed with one or more through holes 15 in the thickness direction thereof; and resin is filled in the through hole section. Consequently, as in the narrowed configuration, breakdown tolerance against stress on the terminal can be improved, a section embedded in the through hole 15 serves as an anchor, strength is enhanced, peeling off of the resin can be prevented, and reliability is improved.

As is apparent from the sectional view of FIG. 2B, molding is performed such that the back surface of the first metal plate 1, that is, a back surface 1a on the opposite side to the surface on which the power semiconductor chip 3 is mounted is exposed from the resin mold package 7 that is low in heat dissipation properties.

Heat generated due to carrying current through the power semiconductor chip 3 spreads to the first metal plate 1 and the heat is dissipated into the air through the resin mold package 7. Ordinarily, since thermal resistance of mold is relatively large, heat dissipation from the mold is not much expected. However, the back surface 1a of the first metal plate 1 is exposed as described above; and consequently, as to be described later in FIG. 7, when the power semiconductor module 100 is disposed on an aluminum heat sink portion 10 that is sufficiently low in thermal resistance, there can be constructed a structure that is good in heat dissipation efficiency by sandwiching a material, which is a heat conductive material that is sufficiently low in thermal resistance and an electrically insulating material, between the back surface 1a of the first metal plate 1 exposed from the resin mold package 7 and the aluminum heat sink portion 10.

FIG. 5A is a plan view in which the resin mold package 7 is seen from the back surface; and FIG. 5B is a sectional view taken along the line B-B.

In FIGS. 5A and 5B, the back surfaces 1a of the first metal plates 1 are exposed from the resin mold package 7 as described before, a plurality of mold resin protrusions 9 are formed on the outer surface of a resin mold package 7a excluding the exposed surfaces 1a of the first metal plates 1, the resin protrusion 9 being protruded from between the plurality of first metal plates 1. The resin protrusion 9 is formed to secure a clearance between the power semiconductor module 100 and the aforementioned aluminum heat sink portion 10 and to also secure clearance accuracy thereof.

The resin protrusion 9 is integrally formed in a transfer mold and securement of height accuracy thereof is easy in the production of manufacturing dies. Furthermore, the plurality of resin protrusions 9 are preferable to be formed uniformly on the back surface of the power semiconductor module 100; however, a design may be appropriately made according to the structure of the first metal plate 1.

According to such a configuration, when the power semiconductor module 100 is placed on the heat sink portion 10, the clearance between the heat sink portion 10 and the heat dissipation surface of the power semiconductor module 100 can be easily secured by the height of the resin protrusion 9, heat dissipation performance is stabilized, and reliability against an electrical short-circuit to the heat sink is improved.

Embodiment 2

Figure 6:
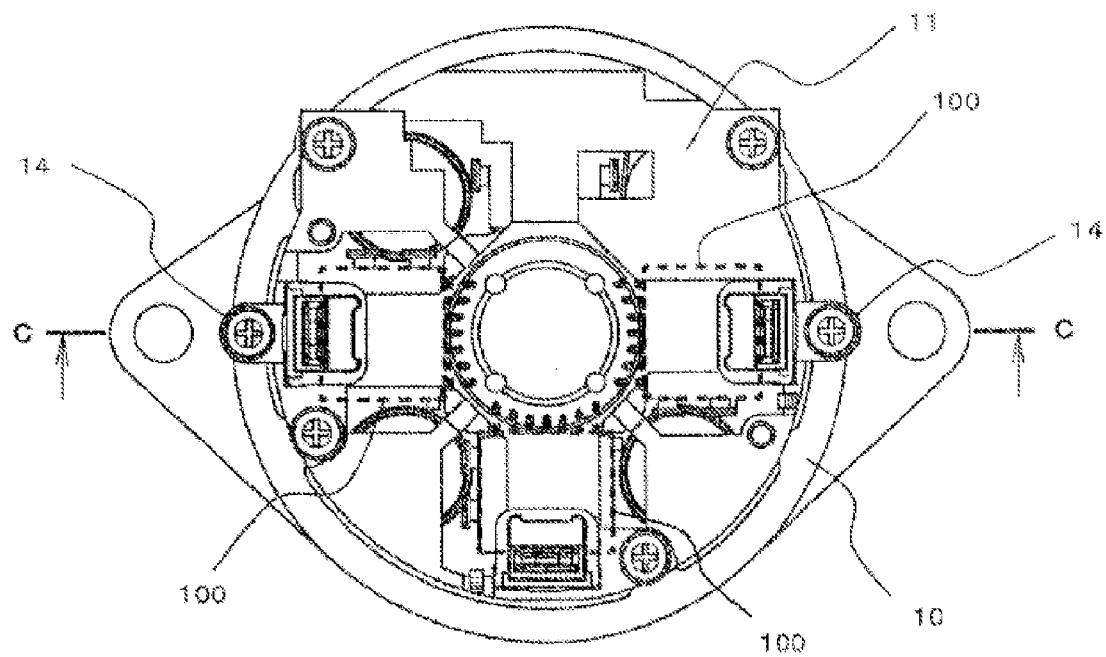
FIG. 6 is a plan view of a device which incorporates a power semiconductor module according to Embodiment 2 of the present invention.
Figure 7:
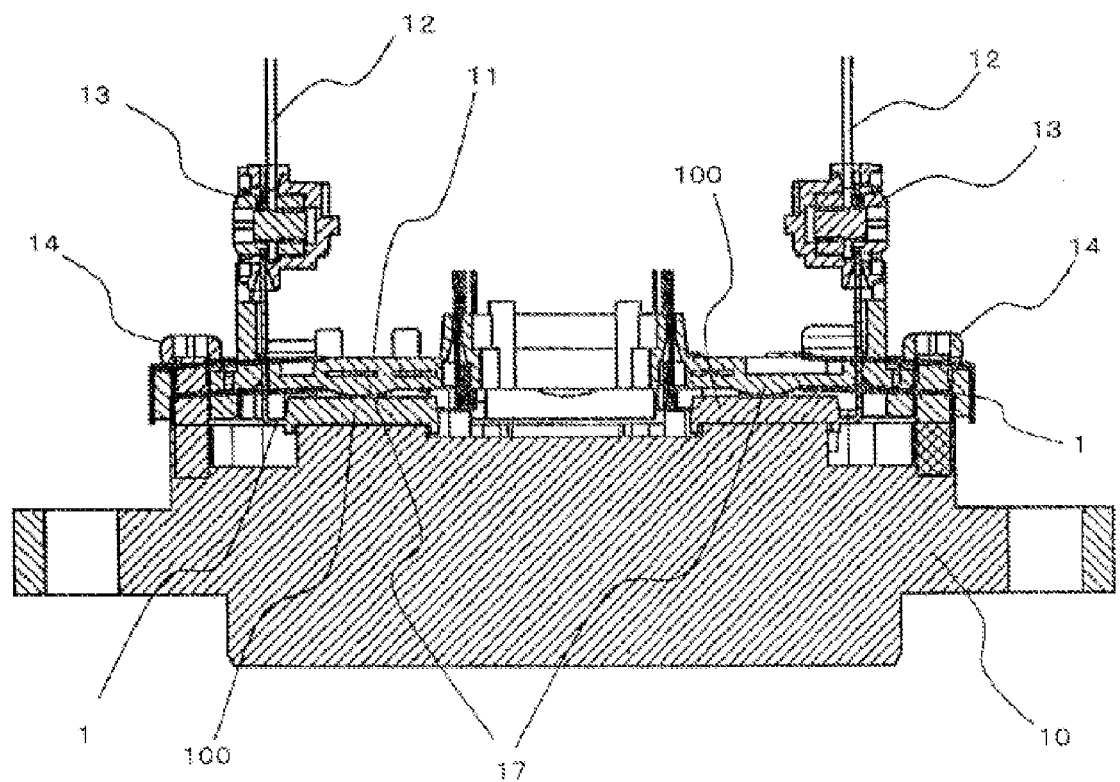
FIG. 7 is a sectional view taken along the line C-C in FIG. 6.

FIG. 6 shows a structural example (a device in which power semiconductor modules are incorporated) in which power semiconductor modules 100 are disposed on a heat sink portion 10 and power lines are connected, as Embodiment 2 according to the present invention. Furthermore, FIG. 7 shows a sectional view taken along the line C-C in FIG. 6. Incidentally, the same reference numerals are given to those corresponding to constitutional elements in Embodiment 1 shown in FIG. 1 to FIG. 4.

FIG. 6 is a power unit device that drives, for example, a three-phase brushless motor; and the heat sink portion 10 which is for dissipating heat emitted from a power section is formed into a shape to be attached to a motor. Furthermore, a heat dissipation surface is formed on the flat surface of the heat sink portion 10 so that the power semiconductor module 100 described in Embodiment 1 can be mounted. As shown in FIGS. 5A and 5B and FIG. 7, the power semiconductor module 100 is formed into a shape capable of being mounted on the heat sink portion 10. Although not shown in the drawing, as described in Embodiment 1, the thermally conductive, electrically insulating member (for example, fluid thermally conductive, electrically insulating resin member) that dissipates the heat from the power semiconductor module 100 is filled (sandwiched) between the power semiconductor module 100 and the heat sink portion 10, and the thickness thereof is secured by the aforementioned resin protrusion 9.

The power semiconductor module 100 is structured to be sandwiched by a resin-made frame 11 and the heat sink portion 10, and the frame 11 is fixed to the heat sink portion 10 by fastening screws 14. When the frame 11 is fixed to the heat sink portion 10, the power semiconductor module 100 needs to be pressed against the heat sink portion 10 by a constant force; and therefore, when the fastening screws 14 are fastened, the frame 11 is designed so as to be deflected a constant amount as shown by thick solid lines in FIG. 7.

When fastened by the fastening screws 14, a fulcrum point that presses the power semiconductor module 100 is misaligned; and accordingly, there is a concern that the power semiconductor module 100 is inclined and fixed with respect to the heat sink portion 10. In order to avoid this concern, a pressing mechanism that presses the power semiconductor module 100 against the heat sink portion 10 is disposed on the upper surface of the power semiconductor module 100. Furthermore, in this example, three power semiconductor modules 100 are disposed on the circumference as shown in FIG. 6.

More specifically, the pressing mechanism is composed of the frame 11, a pressing section 17 of a fan-like raised section in cross-section (sphere-shaped protruded section) formed on the frame 11, and the fastening screw 14 as shown in FIG. 7. A substantially central point on the upper surface of the power semiconductor module is pressed by the pressing section 17, and this causes the power semiconductor module 100 to be constantly perpendicularly pressed against the heat sink portion 10.

As described above, the structure is made to be pressed at the substantially central point on the upper surface of the power semiconductor module 100; and therefore, vertical force is constantly exerted on the heat sink portion 10 also with respect to deformation of an upper surface support structure, the power semiconductor module 100 can be constantly perpendicularly pressed against the heat sink portion 10, the power semiconductor module 100 can be stably disposed without inclining with respect to the heat sink portion 10, suppression of variation in thermal resistance between the heat sink portions 10 due to the inclination of the power semiconductor module 100 can be easily achieved, and heat dissipation properties are stabilized.

In FIG. 7, the first metal plate 1 of the power semiconductor module 100 extends outside from the resin mold package to be bent in an L shape, and passes through a guide of the frame 11 to be drawn out to an upper portion.

On the other hand, a terminal of an actuator 12 and a terminal of the three-phase brushless motor (not shown in this embodiment) extend from opposite directions, and these terminals are arranged so as to be overlapped at a screw 13 section.

The respective terminals are each formed with a screw hole (not shown in the drawing) and are fastened by the screw 13.

An electric power signal from the power unit is transmitted to the three-phase brushless motor through these terminals and power can be generated. A shape is preliminarily designed so that a terminal 4 of a first metal plate 1 can be used as a connection terminal to the outside; and consequently, connection to the actuator becomes easy and it becomes possible to achieve reduction in size of the device.

The first metal plate 1 is of a structure that doubles as the connection terminal to the actuator such as a motor and the number of connection points to external devices is reduced; and consequently, reduction in the number of components, reduction in size, reduction in manufacturing processes, and reduction in cost can be achieved.

Incidentally, in the above embodiment, the description has been made on the case where the power semiconductor module 100 is mounted on and pressed against the heat sink portion 10 only through the thermally conductive, electrically insulating member; however, in order to further improve insulation properties, an electrically insulating member may be sandwiched between the heat sink portion 10 and the power semiconductor module 100. For example, alumite treatment and/or insulation coating may be performed on the surface of the heat sink portion 10 on which the power semiconductor module 100 is mounted, or an insulating ceramic plate and/or a polyimide sheet may be sandwiched therebetween.

In this case, insulation properties are reliably secured by the sandwiching electrically insulating member. Therefore, insulation properties of the heat conductive member to be sandwiched are not required, and it is possible to select a material with high thermal conductivity at the risk of the insulation properties and to configure by a material with thin film thickness of a several μm level. Further, an electrically insulating member with high thermal conductivity is applied to the sandwiching electrically insulating member; and consequently, thermal resistance between the heat sink portion 10 and the power semiconductor module 100 can be considerably reduced.

Compared to the above embodiment, the electrically insulating member is increased in addition to the heat conductive member; however, the function of electrical insulation properties and thermal conductivity are divided; and consequently, it becomes possible to select a wide range of member and it becomes possible to support higher heat dissipation properties and insulation properties at the same time.

(Other Embodiment)

The above-described embodiments are merely exemplifications of the embodiments of the present invention, and alterations may be appropriately made or respective elements of Embodiment 1 and Embodiment 2 may be independent without departing from the spirit or scope of the present invention.

Furthermore, Embodiment 1 is the three-phase bridge inverter circuit that uses the power MOSFET device as the semiconductor device; however, a power semiconductor module having a different circuit function may be permissible. For example, a relay circuit may be permissible or a power semiconductor module that constitutes a part thereof may be permissible.

Furthermore, the semiconductor device is not limited to the power MOSFET device, but a power semiconductor device such as an insulated gate bipolar transistor (IGBT) device may be permissible.

Moreover, a device to be disposed on the module is not limited to only the semiconductor device, but a chip capacitor element and a resistance element may be simultaneously disposed and embedded in the resin package.

In addition, a wire bond may be partially adopted to the electrical connection to the semiconductor device and the metal plate.

The invention claimed is:

1. A power semiconductor module comprising:
a plurality of first metal plates arranged in a same planar state;
at least one power semiconductor chip mounted on at least one of said plurality of first metal plates;
an overbridge-shaped second metal plate comprising a plurality of bridge frame sections and a plurality of leg sections configured to support the bridge frame sections, the plurality of leg sections being configured to permit solder bonding between electrodes of said at least one power semiconductor chip and between said electrode of said at least one power semiconductor chip and at least one of said plurality of first metal plates, and
a resin package which is configured to seal said at least one power semiconductor chip, said plurality of first metal plates, and said overbridge-shaped second metal plate with an electrically insulating resin, and integrally formed with a plurality of protrusions, the plurality of protrusions being disposed on an outer surface excluding an exposed surface of said plurality of first metal plates,
wherein the plurality of leg sections are configured to permit solder bonding at a planar shape located at a bent portion of the plurality of leg sections, and is provided at a position lower than the bridge frame section.

2. The power semiconductor module according to claim 1, wherein said overbridge-shaped second metal plate is formed with a protrusion, which controls an amount of solder, on both of or on either one of a bonding surface with said electrode of said at least one power semiconductor chip and a bonding surface with at least one of said plurality of first metal plates.

3. The power semiconductor module according to claim 1, wherein an external end section of at least one of said plurality of first metal plates forms an external connection terminal, the external end section being drawn out from said resin package,
a base section on the inside of said resin package forming a boundary line section with a mold of said external connection terminal is configured to be formed slimmer than other sections at a narrowed configuration section, and
the narrowed configuration section is configured to be filled with the resin.

4. The power semiconductor module according to claim 2, wherein an external end section of at least one of said plurality of first metal plates forms an external connection terminal, the external end section being drawn out from said resin package,
a base section on the inside of said resin package forming a boundary line section with a mold of said external connection terminal is configured to be formed slimmer than other sections at a narrowed configuration, and the narrowed configuration section is configured to be filled with the resin.

5. The power semiconductor module according to claim 3, wherein the base section is configured to be formed with a through hole therein, and the through hole section is configured to be filled with the resin.

6. The power semiconductor module according to claim 4, wherein the base section is configured to be formed with a through hole therein, and the through hole section is configured to be filled with the resin.

7. The power semiconductor module according to claim 3, wherein said external connection terminal doubles as a connection terminal with an actuator.

8. The power semiconductor module according to claim 4, wherein said external connection terminal doubles as a connection terminal with an actuator.

9. The power semiconductor module according to claim 5, wherein said external connection terminal doubles as a connection terminal with an actuator.

10. The power semiconductor module according to claim 6, wherein said external connection terminal doubles as a connection terminal with an actuator.

11. A power unit device in which a power semiconductor module as set forth in claim 1 is placed on a heat sink portion, said power unit device comprising:
a heat conductive member which is sandwiched between said power semiconductor module and said heat sink portion, said heat conductive member being for dissipating heat from said power semiconductor module; and
a pressing mechanism which presses said power semiconductor module against said heat sink portion via said heat conductive member.

12. A power unit device in which a power semiconductor module as set forth in claim 2 is placed on a heat sink portion, said power unit device comprising:
a heat conductive member which is sandwiched between said power semiconductor module and said heat sink portion, said heat conductive member being for dissipating heat from said power semiconductor module; and
a pressing mechanism which presses said power semiconductor module against said heat sink portion via said heat conductive member.

13. The power unit device according to claim 11, further comprising an electrically insulating member which is sandwiched both of or either one of between said heat conductive member and said power semiconductor module and between said heat conductive member and said heat sink portion.

14. The power unit device according to claim 12, further comprising an electrically insulating member which is sandwiched both of or either one of between said heat conductive member and said power semiconductor module and between said heat conductive member and said heat sink portion.

15. The power unit device according to claim 11, wherein said pressing mechanism has a sphere-shaped pressing section which presses said power semiconductor module, and the sphere-shaped pressing section is disposed at a substantially central section of an upper portion of said power semiconductor module.

16. The power unit device according to claim 12, wherein said pressing mechanism has a sphere-shaped pressing section which presses said power semiconductor module, and the sphere-shaped pressing section is disposed at a substantially central section of an upper portion of said power semiconductor module.

17. The power unit device according to claim 11, wherein said resin package is formed with a plurality of protrusions, which secures a clearance between said power semiconductor module and said heat sink portion, on an outer surface excluding an exposed surface of said first metal plate, the plurality of protrusions being integrally formed with said resin package.

18. The power unit device according to claim 12, wherein said resin package is formed with a plurality of protrusions, which secures a clearance between said power semiconductor module and said heat sink portion, on an outer surface excluding an exposed surface of said first metal plate, the plurality of protrusions being integrally formed with said resin package.

19. The power unit device according to claim 1, wherein the plurality of protrusions secure a clearance between said power semiconductor module and a heat sink portion.

20. The power unit device according to claim 2, wherein the plurality of protrusions secure a clearance between said power semiconductor module and a heat sink portion.

21. The power unit device according to claim 1, wherein aback surface of the plurality of first metal plates, on an opposite side to the surface on which said at least one power semiconductor chip is mounted, are exposed from said resin package as a heat dissipation surface.

* * * * *